United States Patent
Tsuji

(10) Patent No.: US 10,170,890 B2
(45) Date of Patent: Jan. 1, 2019

(54) METHOD OF FABRICATING SEMICONDUCTOR OPTICAL DEVICE AND SURFACE-EMITTING SEMICONDUCTOR LASER

(71) Applicant: SUMITOMO ELECTRIC INDUSTRIES, LTD., Osaka (JP)

(72) Inventor: Yukihiro Tsuji, Tama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/906,515

(22) Filed: Feb. 27, 2018

(65) Prior Publication Data

US 2018/0287346 A1 Oct. 4, 2018

(30) Foreign Application Priority Data

Apr. 3, 2017 (JP) ................................. 2017-073938

(51) Int. Cl.
| | |
|---|---|
| *H01S 5/183* | (2006.01) |
| *H01S 5/042* | (2006.01) |
| *H01S 5/02* | (2006.01) |
| *H01S 5/125* | (2006.01) |

(52) U.S. Cl.
CPC ........ *H01S 5/18361* (2013.01); *H01S 5/0217* (2013.01); *H01S 5/0425* (2013.01); *H01S 5/125* (2013.01); *H01S 5/18344* (2013.01); *H01S 5/18352* (2013.01); *H01S 5/18397* (2013.01)

(58) Field of Classification Search
CPC .. H01S 5/18361; H01S 5/18352; H01S 5/125; H01S 5/18397; H01S 5/18344; H01S 5/0425; H01S 5/0217
See application file for complete search history.

(56) References Cited

U.S. PATENT DOCUMENTS

| | | | | |
|---|---|---|---|---|
| 8,189,642 B1* | 5/2012 | Li | ........................ | H01S 5/18352 372/46.013 |
| 2009/0032908 A1* | 2/2009 | Masui | ..................... | H01L 22/12 257/623 |
| 2009/0141766 A1* | 6/2009 | Onishi | ................... | B82Y 20/00 372/50.11 |
| 2011/0076854 A1* | 3/2011 | Takeo | ................. | H01S 5/18313 438/745 |

FOREIGN PATENT DOCUMENTS

JP 5034662 7/2012

* cited by examiner

*Primary Examiner* — Yuanda Zhang

(74) *Attorney, Agent, or Firm* — Smith, Gambrell & Russell, LLP.

(57) ABSTRACT

A surface-emitting semiconductor laser has a semiconductor structure that includes a first side, a second side opposite to the first side, and a side surface that extends from the second side to the first side; a first electrode provided on the first side of the semiconductor structure; and a second electrode provided on the first side of the semiconductor structure. The semiconductor structure also includes a substrate, a first stacked semiconductor layer disposed on the substrate, an active layer disposed on the first stacked semiconductor layer, and a second stacked semiconductor layer disposed on the active layer. The first stacked semiconductor layer includes a first distributed Bragg reflector, and the second stacked semiconductor layer includes a second distributed Bragg reflector. The semiconductor structure side surface has at least an upper surface that is free of chipping.

8 Claims, 17 Drawing Sheets

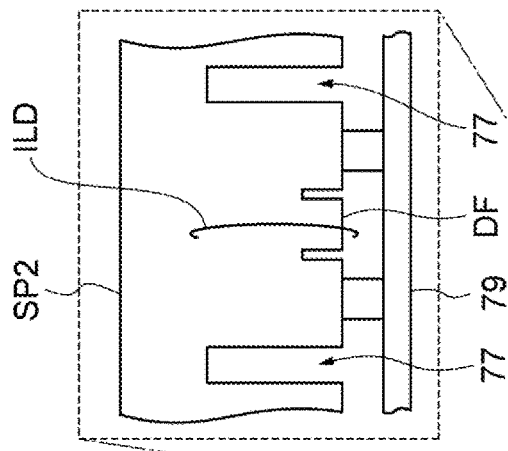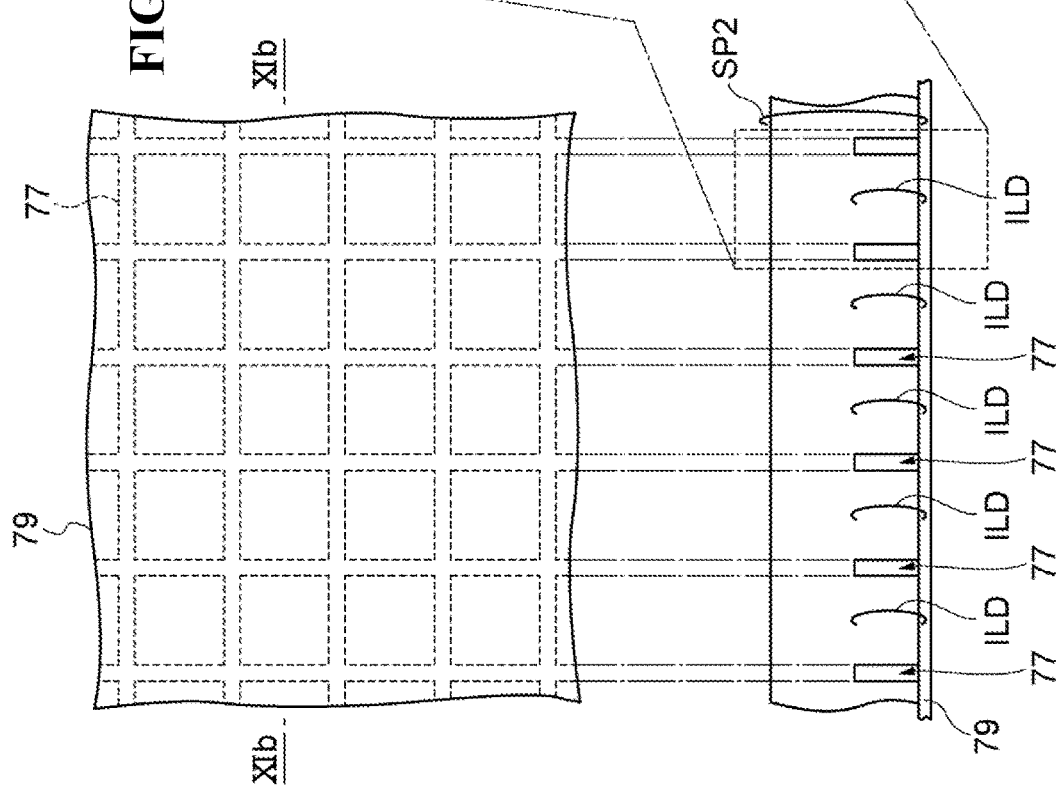

METHOD OF FABRICATING SEMICONDUCTOR OPTICAL DEVICE AND SURFACE-EMITTING SEMICONDUCTOR LASER

BACKGROUND OF THE INVENTION

1. Field of the Invention

The present invention relates a method of fabricating a semiconductor optical device and a surface-emitting semiconductor laser.

2. Description of the Related Art

Japanese Patent No. 5034662 discloses a surface-emitting semiconductor laser formed by dicing.

SUMMARY OF THE INVENTION

In order to fabricate vertical cavity surface-emitting lasers (VCSELs), a method of forming a substrate product has been discussed. With this method, the substrate product includes device regions and a street region in a device area. The device regions are arranged in an array. The street region separates the device area into the device regions.

The VCSELs are suited for size-reduced devices. Meanwhile, even when the size of each device is reduced, the street region needs a specified width, and the width of the street region is not changed. For example, as a method of separating the device area into the device regions, dicing is known. When separating the device area into the device regions by mechanically processing a wafer using a dicing blade, chipping occurs at the periphery of each of the devices. Accordingly, in order to avoid such chipping and eliminate the effects of the chipping on the device regions, a margin of a certain amount or larger is required for the width of the street region. As a result, it has been found that, due to an increase in the number of device sections per wafer realized by size reduction of the devices, the area of the street region that defines the device sections may increase. Furthermore, it has been found that the ratio of the device size to the width of the street region may increase.

A method of fabricating a semiconductor optical device according to an aspect of the present invention includes the steps of preparing a substrate product that includes a first side and a second side opposite to the first side, the first side including device sections arranged in an array and a street region extending between the device sections, each of the device sections including an electrode and a semiconductor structure for forming the semiconductor optical device; forming a first mask on the first side of the substrate product, the first mask having a pattern that includes device covering portions covering the respective device sections and an opening defining the device covering portions, the opening being provided in the street region; etching the substrate product using the first mask so as to form a groove in the street region, the groove defining the device sections; after removing the first mask, securing the first side of the substrate product to a first support member; and after securing the first side of the substrate product to the first support member, forming an array of semiconductor chips on the first support member by removing part of the substrate product from the second side until the groove provided in the first side is exposed so as to separate the device sections from each other.

A surface-emitting semiconductor laser according to another aspect of the present invention includes a semiconductor structure that includes a first side, a second side opposite to the first side, and a side surface that extends from the second side to the first side, the side surface having an upper side without chipping; a first electrode provided on the first side of the semiconductor structure; and a second electrode provided on the first side of the semiconductor structure. The semiconductor structure includes a substrate, a first stacked semiconductor layer disposed on the substrate, an active layer disposed on the first stacked semiconductor layer, and a second stacked semiconductor layer disposed on the active layer. In addition, the first stacked semiconductor layer includes a first distributed Bragg reflector, and the second stacked semiconductor layer includes a second distributed Bragg reflector.

These and other objects, features, and advantages of the present invention will be more easily clarified from the following detailed description of a preferred embodiment of the present invention described with reference to the accompanying drawings.

BRIEF DESCRIPTION OF THE DRAWINGS

FIGS. 11A, 11B, and 11C schematically illustrate the array of the device sections for the substrate product in the method of fabricating a surface-emitting semiconductor laser according to the present embodiment.

DESCRIPTION OF THE PREFERRED EMBODIMENTS

Figure 1A:
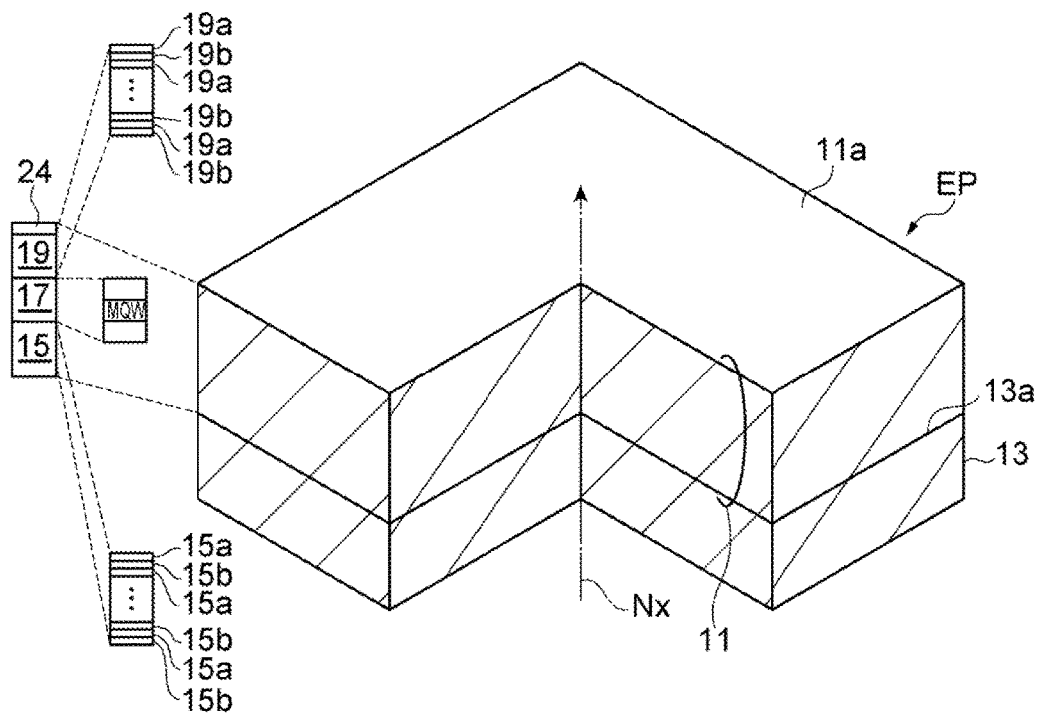
FIGS. 1A and 1B schematically illustrate main steps of a method of fabricating a surface-emitting semiconductor laser according to an embodiment.

Continuing from the above description, some specific embodiments will now be described.

A method of fabricating a semiconductor optical device according to an embodiment includes (a) a step of preparing a substrate product that includes a first side and a second side opposite to the first side, the first side including device sections arranged in an array and a street region extending between the device sections, each of the device sections including an electrode and a semiconductor structure for forming the semiconductor optical device; (b) a step of forming a first mask on the first side of the substrate product, the first mask having a pattern that includes device covering portions covering the respective device sections and an opening defining the device covering portions, the opening being provided in the street region; (c) a step of etching the substrate product using the first mask so as to form a groove in the street region, the groove defining the device sections; (d) a step of, after removing the first mask, securing the first side of the substrate product to a first support member; and (e) a step of, after securing the first side of the substrate product to the first support member, forming an array of semiconductor chips on the first support member by removing part of the substrate product from the second side until the groove provided in the first side is exposed so as to separate the device sections from each other.

According to the method of fabricating a semiconductor optical device, the doughnut-shaped groove surrounding the device sections is formed in the street region of the substrate product by etching. The array of the semiconductor chips is formed on the first support member by removing part of the substrate product from the second side until the groove provided in the first side is exposed so as to separate the device sections from each other. In this process, the thickness of the substrate product is reduced by removing part of the substrate product from the second side. The width of the street region may be determined in accordance with a width of the groove that may be formed by photolithography and etching. Usually, in order to separate the device area into the device regions, the substrate product is cut away at the street region by using a dicing saw. In the present embodiment, the width of the street region may be reduced compared to a method with which the device area is separated into the device regions by using the dicing saw. This allows the device size per wafer to be reduced. In other words, the number of devices that can be fabricated from a single wafer or the yield of device per wafer may be improved.

In the method of fabricating a semiconductor optical device according to an embodiment, in the step of forming the array of the semiconductor chips on the first support member, the substrate product may be partially removed by polishing the substrate product from the second side.

In the method of fabricating a semiconductor optical device according to an embodiment, the semiconductor optical device may include a vertical cavity surface-emitting laser.

According to the method of fabricating a semiconductor optical device, the vertical cavity surface-emitting laser (VCSEL) without chipping is obtained. The VCSEL does not include an end surface of a resonator formed by cleavage. In the method for fabricating the VCSEL, in order to separate the device area into the device regions, the substrate product is usually cut away at the street region by using a dicing saw. Mechanical processing of a wafer with a dicing blade causes various types of chipping. In the method of fabricating a semiconductor optical device, the occurrences of chipping may be avoided in the process for forming the VCSEL.

The method of fabricating a semiconductor optical device according to an embodiment may further include a step of transferring the array of the semiconductor chips from the first support member to a second support member.

According to the method of fabricating a semiconductor optical device, the second support member may support rear surfaces of the semiconductor chips.

The method of fabricating a semiconductor optical device according to an embodiment may further include a step of separating each of the semiconductor chips from the second support member.

According to the method of fabricating a semiconductor optical device, front surface sides of device structures of the semiconductor chips may be held by a collet.

In the method of fabricating a semiconductor optical device according to an embodiment, the first mask includes a resist having a thickness of 100 micrometers or larger.

According to the method of fabricating a semiconductor optical device, the resist allows a pattern to be formed.

In the method of fabricating a semiconductor optical device according to an embodiment, the first mask includes a dry film resist.

According to the method of fabricating a semiconductor optical device, a dry resist film may provide a thick-film mask patterned by photolithography.

The method of fabricating a semiconductor optical device according to an embodiment may further include the steps of forming a second mask having a smaller thickness than a thickness of the first mask on the substrate product; and etching the substrate product using the second mask so as to form mesa structures having inclined side surfaces. The inclined surfaces extend from boundaries between the device sections and the street region. In addition, the electrode is provided on each of the mesa structures.

According to the method of fabricating a semiconductor optical device, contact of a collet with the surfaces of the device structures may be avoided.

A surface-emitting semiconductor laser according to an embodiment includes a semiconductor structure that includes a first side, a second side opposite to the first side, and a side surface that extends from the second side to the first side, the side surface having an upper side without chipping; a first electrode provided on the first side of the semiconductor structure; and a second electrode provided on the first side of the semiconductor structure. The semiconductor structure includes a substrate, a first stacked semiconductor layer disposed on the substrate, an active layer disposed on the first stacked semiconductor layer, and a second stacked semiconductor layer disposed on the active layer. In addition, the first stacked semiconductor layer includes a first distributed Bragg reflector, and the second stacked semiconductor layer includes a second distributed Bragg reflector.

In the surface-emitting semiconductor laser, the side surface is formed by etching. Processing through etching allows a side surface to have small surface roughness and does not form chipping on the upper side of the side surface. With the chipping-free upper side of the device side surface having preferable surface roughness, it is not required that a device size of the surface-emitting semiconductor laser include margins for chipping.

In the surface-emitting semiconductor laser according to an embodiment, preferably, the side surface includes a first surface that extends from a rear surface of the substrate in a first direction extending from the second side to the first side and a second surface extending in a second direction inclined relative to the first surface and the first direction.

In the surface-emitting semiconductor laser, the inclination of the second surface of the side surface may reduce damage to the device during the assembly.

Findings of the present invention can be easily understood in consideration of the following detailed description with reference to the accompanying drawings presented as examples. Next, embodiments relating to a method of fabricating a semiconductor optical device and a surface-emitting semiconductor laser according to the present invention will be described with reference to the accompanying drawings. Where possible, like reference signs denote like elements.

An example relating to a method of fabricating a surface-emitting semiconductor laser is described with reference to FIGS. 1A, 1B to 14A, 14B, and 14C. FIGS. 1A and 1B, 3A and 3B, 4, 7, and 8 illustrate a single device section of a surface-emitting semiconductor laser out of a plurality of device sections of surface-emitting semiconductor lasers to be fabricated. According to the present embodiment, a procedure of fabricating, for example, vertical cavity surface-emitting lasers (VCSELs) is described.

As illustrated in FIG. 1A, in step S101, an epitaxial substrate EP for forming the surface-emitting semiconductor lasers is prepared. The epitaxial substrate EP includes a substrate 13 and a stacked semiconductor layer 11 provided on a principal surface 13a of the substrate 13. The stacked semiconductor layer 11 includes a first stacked semiconductor layer 15 for forming a first distributed Bragg reflector, a semiconductor region 17 for forming an active layer, and a second stacked semiconductor layer 19 for forming a second distributed Bragg reflector. The first stacked semiconductor layer 15, the semiconductor region 17, and the second stacked semiconductor layer 19 are arranged in a direction of a normal axis Nx of the principal surface 13a of the substrate 13. The semiconductor region 17 includes a quantum well structure MQW for generating light. The stacked semiconductor layer 11 of the epitaxial substrate EP may include an upper contact layer 24 according to need. In the present embodiment, the epitaxial substrate EP is fabricated for preparing the epitaxial substrate EP. The substrate 13 for epitaxial growth is prepared. The substrate 13 includes a semiconductor wafer, specifically, a GaAs wafer. The first stacked semiconductor layer 15 includes first semiconductor layers 15a and second semiconductor layers 15b. The first semiconductor layers 15a and the second semiconductor layers 15b are alternately stacked in the normal axis Nx direction so that a distributed Bragg reflector is configured. The second stacked semiconductor layer 19 includes third semiconductor layers 19a and fourth semiconductor layers 19b. The third semiconductor layers 19a and the fourth semiconductor layers 19b are alternately stacked in the normal axis Nx direction so that another distributed Bragg reflector is configured. The stacked semiconductor layer 11 is grown by using, for example, either or both of a molecular beam epitaxy method and a metal-organic vapor phase epitaxy method.

Figure 1B:
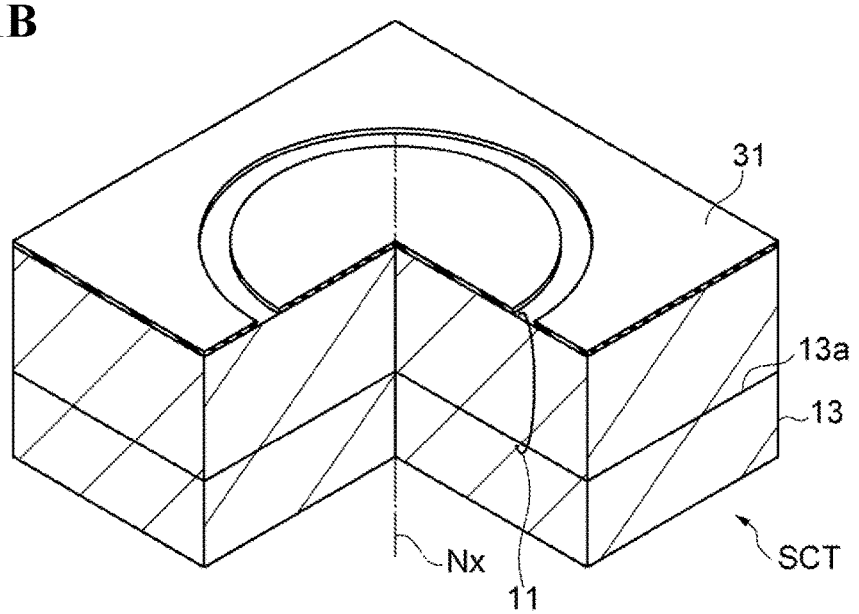

An example of the epitaxial substrate EP
First stacked semiconductor layer 15: GaAs/AlGaAs super lattice
First semiconductor layers 15a: GaAs
Second semiconductor layers 15b: AlGaAs
Semiconductor region 17
Quantum well structure MQW: AlGaAs/GaAs
Second stacked semiconductor layer 19: GaAs/AlGaAs super lattice
Third semiconductor layers 19a: GaAs
Fourth semiconductor layers 19b: AlGaAs
Upper contact layer 24: GaAs As illustrated in FIG. 1B, in step S102, a mask 31 is formed on the epitaxial substrate EP. The mask 31 defines semiconductor posts for respective device sections SCT. The semiconductor posts include laser resonators. For fabricating the mask 31, an inorganic insulating layer is formed on a principal surface 11a of the stacked semiconductor layer 11 of the epitaxial substrate EP. The inorganic insulating layer is, for example, a silicon-based inorganic insulating layer made of a silicon oxide, a silicon nitride, or a silicon oxynitride. The inorganic insulating layer is processed by using a photolithography method and an etching method to form the mask 31 having a pattern for forming the semiconductor posts. In the photolithography step, a resist is applied to the inorganic insulating layer for forming a mask pattern.

Figure 2:
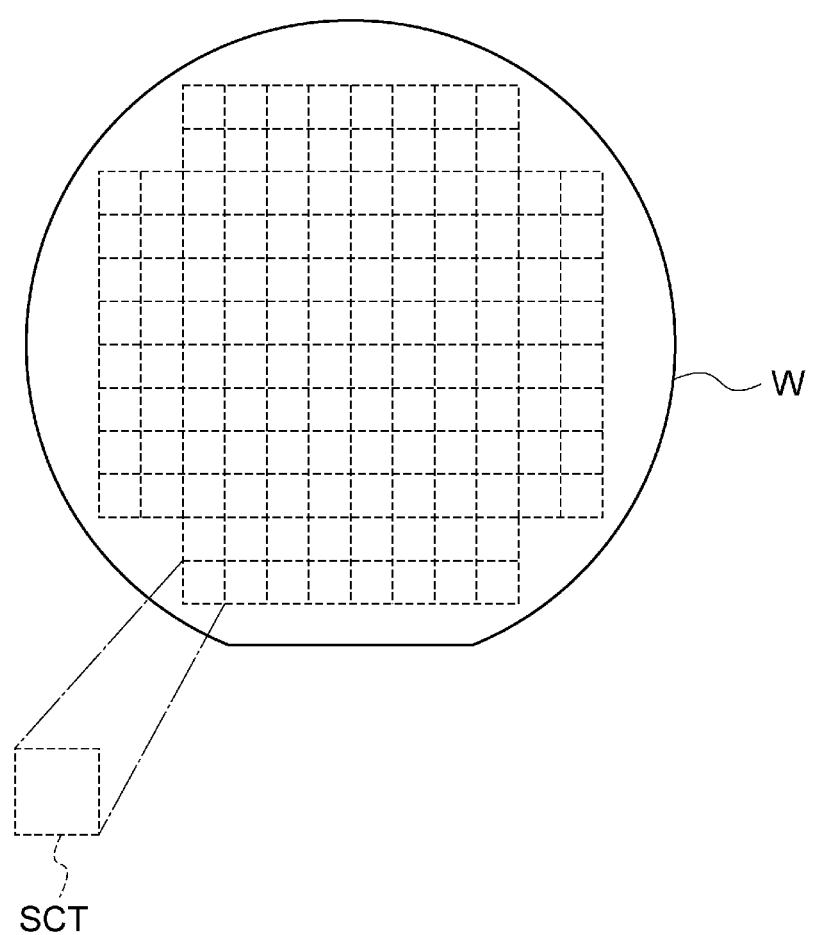
FIG. 2 schematically illustrates an array of device sections for wafer products in the method of fabricating a surface-emitting semiconductor laser according to the present embodiment.

FIG. 2 is a plan view illustrating arrangement of the device sections on the principal surface of the epitaxial substrate according to the present embodiment. The substrate 13 is a GaAs wafer W. The device sections SCT are two-dimensionally arranged. In the device sections SCT, the surface-emitting semiconductor lasers are formed through subsequent steps.

Figure 3A:
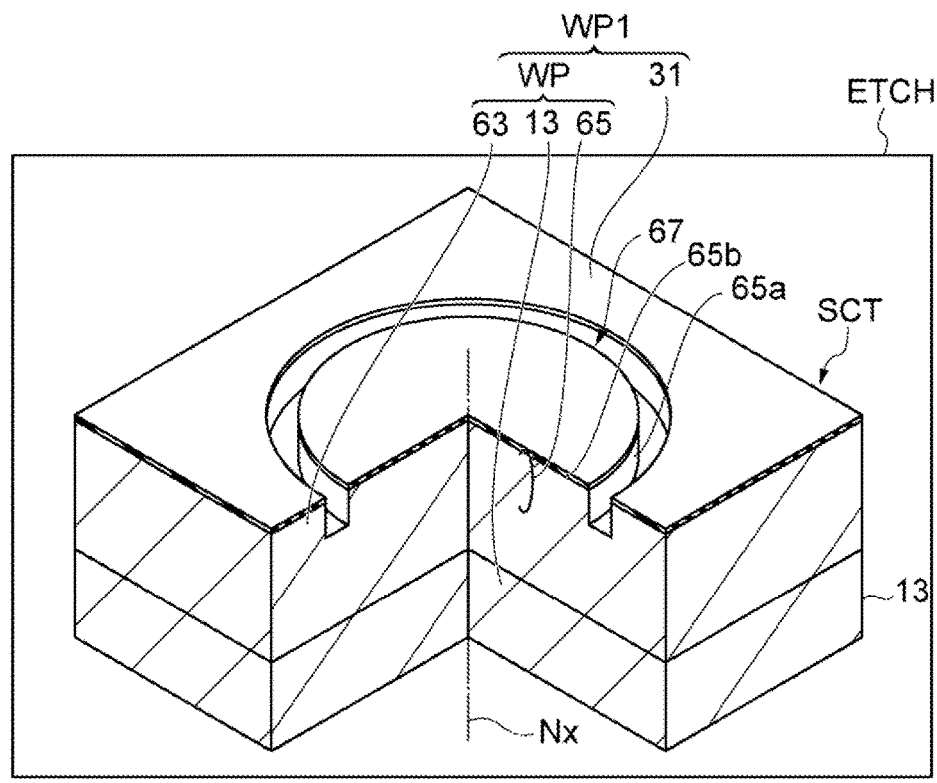
FIGS. 3A and 3B schematically illustrate main steps of the method of fabricating a surface-emitting semiconductor laser according to the present embodiment.

In step S103, after the mask 31 has been formed, the epitaxial substrate EP is placed on an etching apparatus ETCH1 as illustrated in FIG. 3A. Gas is discharged from a chamber of the etching apparatus ETCH1. The pressure in the chamber may be set to a desired value by evacuating the chamber using a discharge pump while causing a process gas to flow. Specifically, after the chamber has been evacuated, a gas containing a process gas and an etchant is supplied to the etching apparatus ETCH1 to start etching of the semiconductor layer. The process gas is either or both of hydrogen and helium. The etchant contains, for example, either or both of boron trichloride ($BCl_3$) and chlorine ($Cl_2$).

In fabrication of the VCSELs, a semiconductor multilayer is etched. As a result of this etching, an intermediate product WP1 is fabricated from the epitaxial substrate EP. After the intermediate product WP1 has been removed from the etching apparatus ETCH1, the mask 31 is removed. As a result of the removal of the mask, wafer products WP are fabricated from the epitaxial substrate EP. Each of the wafer products WP includes the substrate 13, a stacked semiconductor layer 63, a corresponding one of the semiconductor posts 65, and a first groove 67. The semiconductor post 65 includes the first distributed Bragg reflector, the active layer, and the second distributed Bragg reflector derived from an epitaxial structure of the epitaxial substrate EP. The first distributed Bragg reflector, the active layer, and the second distributed Bragg reflector are arranged in the normal axis Nx direction. The semiconductor post 65 has a side surface 65a that extends in the normal axis Nx direction and an upper surface 65b that extends along a plane intersecting the normal axis Nx direction. The first grooves 67 each defines a corresponding one of the semiconductor posts 65 and separate the semiconductor post 65 from the stacked semiconductor layer 63. The first groove 67 has a depth of, for example, 5 micrometers.

Figure 3B:
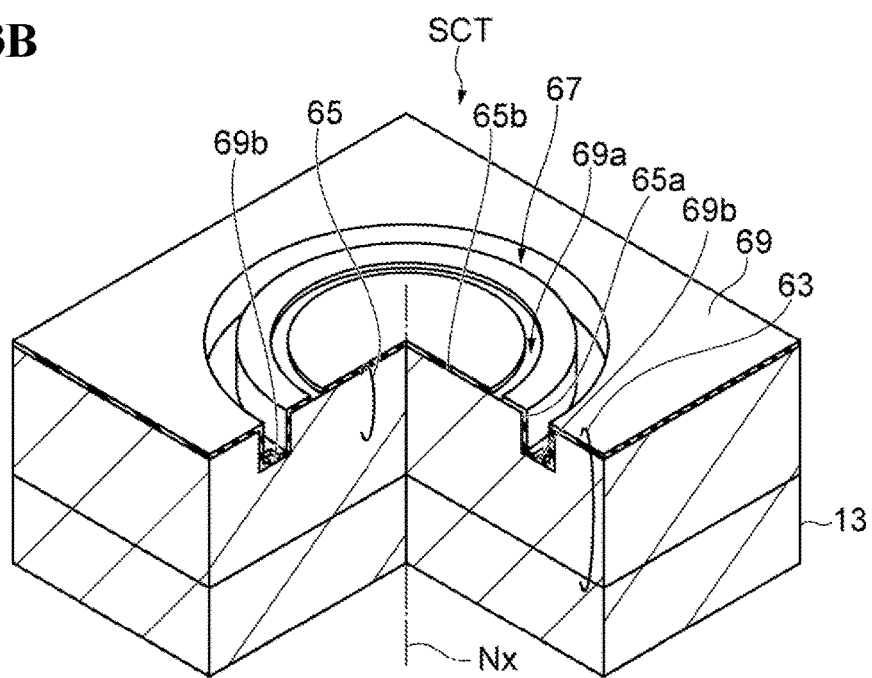

As illustrated in FIG. 3B, a passivation film 69 is formed on the wafer product WP in step S104. In the present embodiment, the passivation film 69 has first openings 69a and second openings 69b. The first openings 69a are each provided on the upper surface 65b of the semiconductor post 65. The second openings 69b are located at the bottom surfaces of the first grooves 67. Specifically, first, a protective film for forming the passivation film 69 is formed. The protective film is made of a silicon-based inorganic insulator such as SiN, SiON, or $SiO_2$. The protective film is formed by using, for example, a plasma chemical vapor deposition (CVD) method. The film thickness of the protective film is adjusted so that the passivation film 69 is a high reflectivity film for the wavelength of light emitted by the surface-emitting semiconductor lasers. The protective film is formed over the entire surface of the wafer product WP. In the protective film, openings for forming electrodes (the first openings 69a and the second openings 69b) are formed by using a photolithography method and an etching method so as to obtain the passivation film 69.

Figure 4:
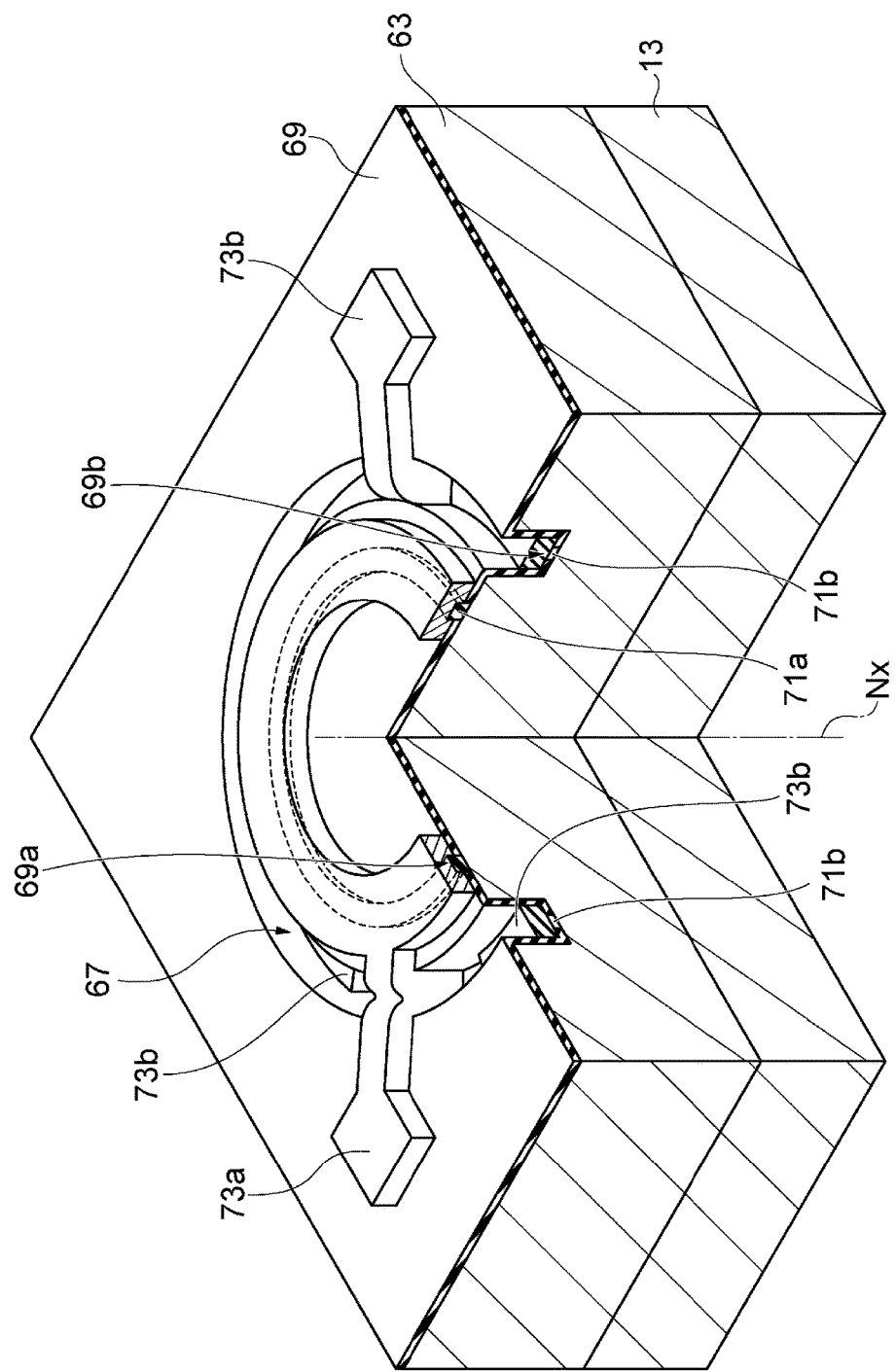
FIG. 4 is a partial cutaway view schematically illustrating main steps of the method of fabricating a surface-emitting semiconductor laser according to the present embodiment.

As illustrated in FIG. 4, in step S105, a first ohmic electrode 71a is formed in each of the first openings 69a of the passivation film 69, and a second ohmic electrode 71b is formed in each of the second openings 69b of the passivation film 69. Furthermore, a first electrode 73a and a second electrode 73b are formed so as to be respectively connected to the first ohmic electrode 71a and the second ohmic electrode 71b. The first ohmic electrode 71a and the second ohmic electrode 71b include, for example, Ti/Pt/Au stacks. Furthermore, the first electrode 73a and the second electrode 73b include thick gold films formed by a plating method.

Figure 5:
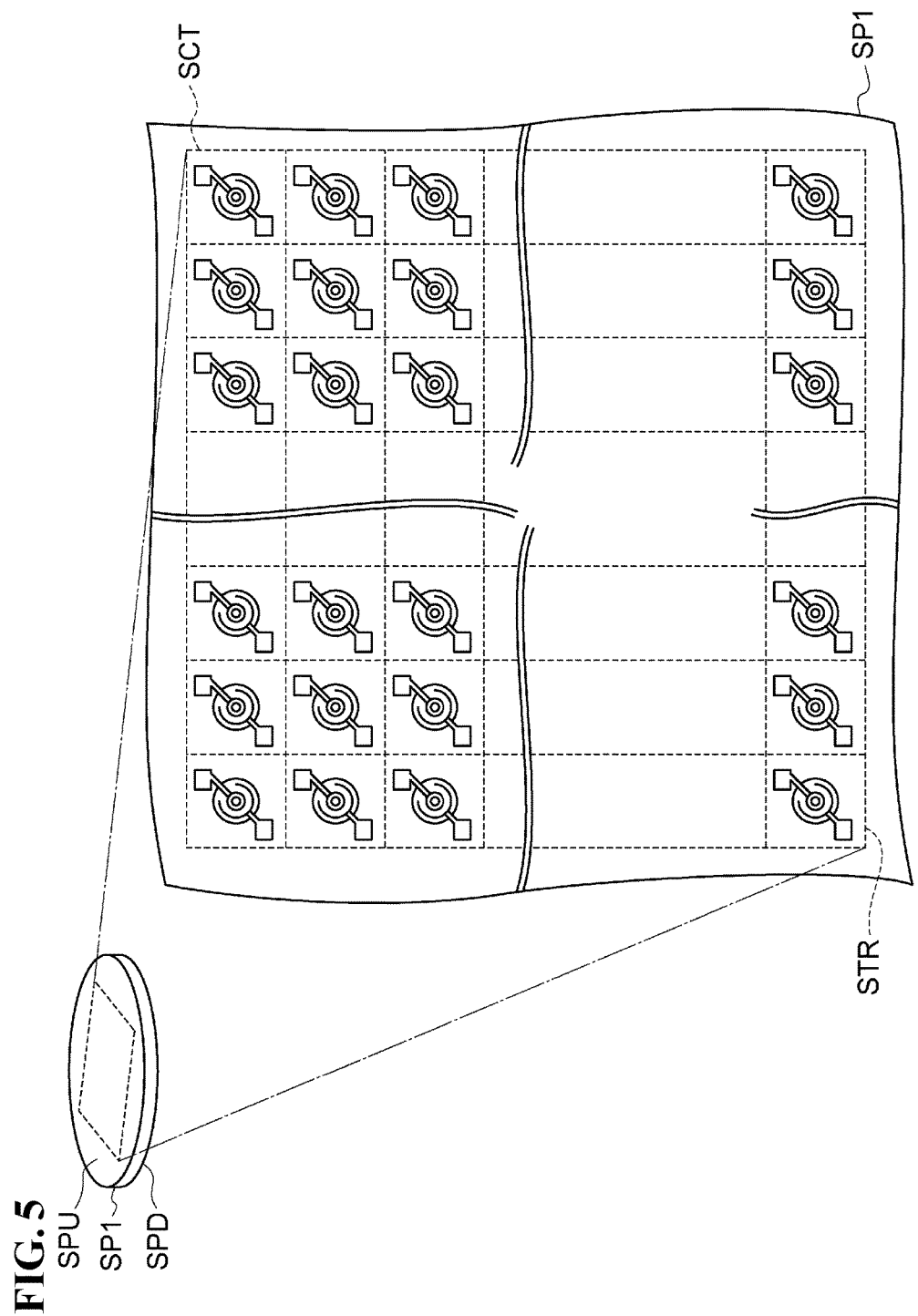
FIG. 5 schematically illustrates the array of the device sections for a substrate product in the method of fabricating a surface-emitting semiconductor laser according to the present embodiment.

As a result of these steps, as illustrated in FIG. 5, a first substrate product SP1 for forming the surface-emitting semiconductor lasers is fabricated. In the present embodiment, the first substrate product SP1 is prepared by, for example, the above-described fabrication. The first substrate product SP1 has a first side SPU and a second side SPD. The first side SPU includes a device sections SCT arranged in an array and a street region STR that extends between the device sections SCT. The second side SPD exists on the opposite side to the first side SPU. In FIG. 5, the street region STR is drawn by broken lines for indicating the position of the street region STR.

Figure 6:
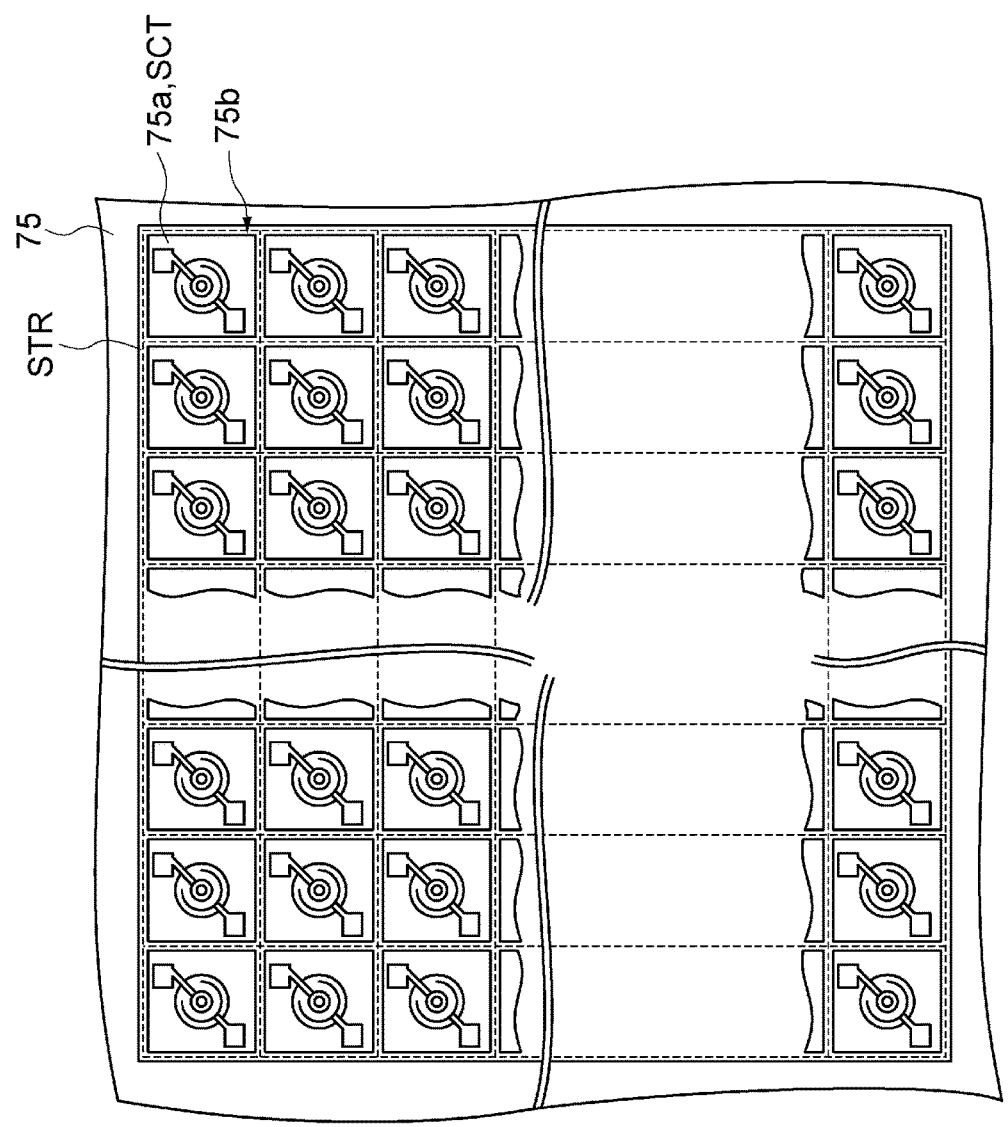
FIG. 6 schematically illustrates the array of the device sections for the substrate product in the method of fabricating a surface-emitting semiconductor laser according to the present embodiment.
Figure 7:
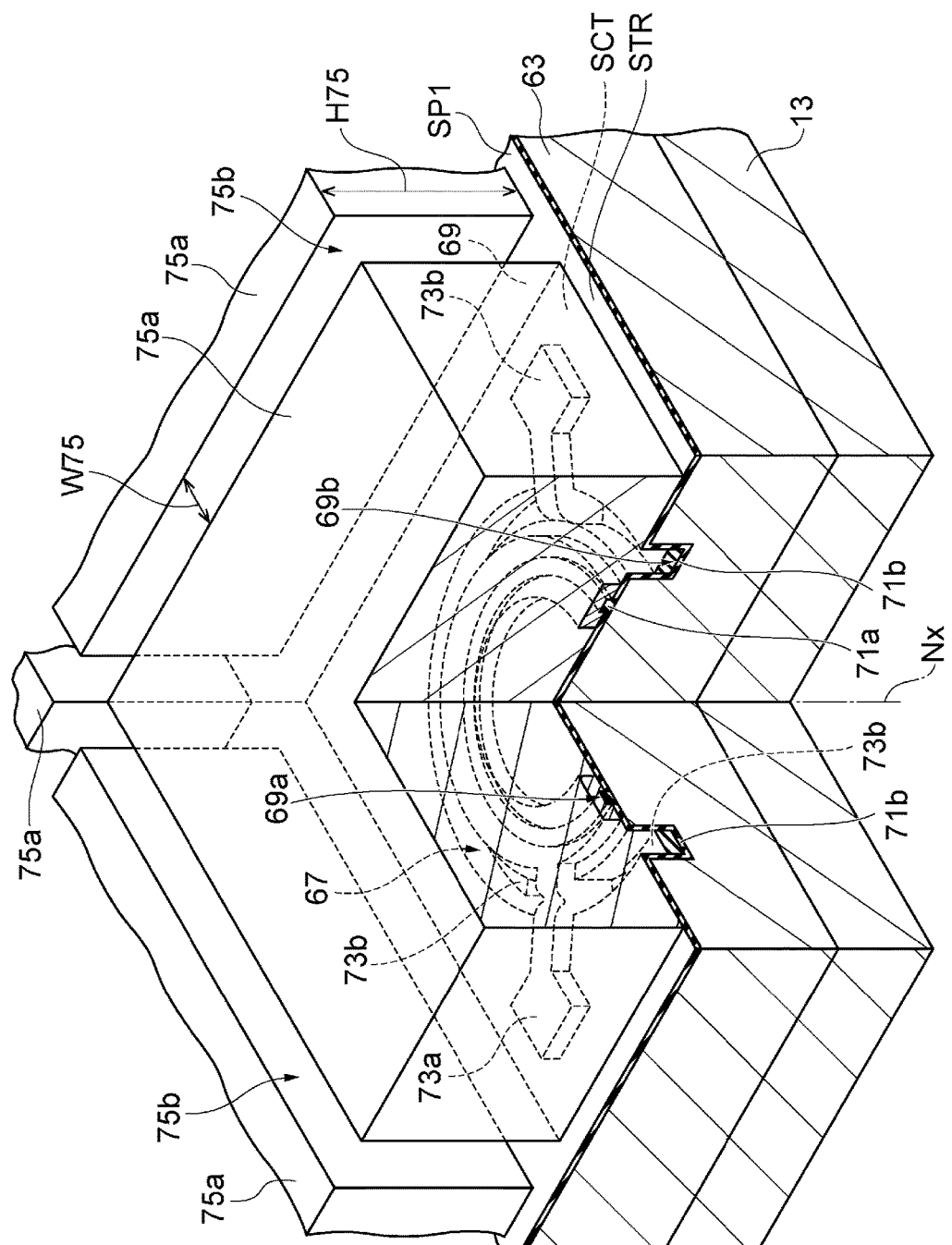
FIG. 7 is a partial cutaway view schematically illustrating a main step of the method of fabricating a surface-emitting semiconductor laser according to the present embodiment.

As illustrated in FIG. 6, a mask 75 is formed on the first side SPU of the first substrate product SP1 in step S106. The mask 75 has device covering portions 75a and a first opening 75b. The device covering portions 75a cover the respective device sections SCT. In the present embodiment, a single first opening 75b is provided in the street region STR. Furthermore, the single first opening 75b defines the device covering portions 75a. The first opening 75b surrounds the device covering portions 75a. Referring to FIG. 7, the device covering portions 75a of the mask 75 cover the device sections SCT. The mask 75 is made of a thick resist layer having a comparatively large thickness. A thickness (H75) of the resist layer ranges from 50 to 100 micrometers. According to the present embodiment, the thickness (H75) of the resist layer is, for example, 100 micrometers. Such a thick resist (photoresist) layer is formed by, for example, bonding a dry film resist or applying a negative resist (high-viscosity epoxy-based resist) for micro electromechanical systems (MEMS). Furthermore, a pattern of the thick resist layer is formed by, for example, contact exposure of the photoresist using a mask aligner or exposure of the photoresist to a reduced projection light using a stepper. Development is performed after the exposure. The size of the device sections SCT is, for example, 200-micrometer square. A width (W75) of the first opening 75b ranges from 10 to 50 micrometers. According to the present embodiment, the width W75 is, for example, 10 micrometers. The width of the first opening 75b is determined in consideration of the fact that the aspect ratio of the opening pattern that can be formed through exposure and development of the photoresist is 10. For example, for a resist layer having a thickness of 100 micrometers, the lower limit of the width is 10 micrometers. The width of the first opening 75b is smaller than the width of an area to be cut away (for example, 60 micrometers) required for fabrication of semiconductor chips using a dicing saw. The device covering portions 75a and the first opening 75b of the mask 75 are provided outside a device area in which the array of the device sections SCT is included.

Figure 8:
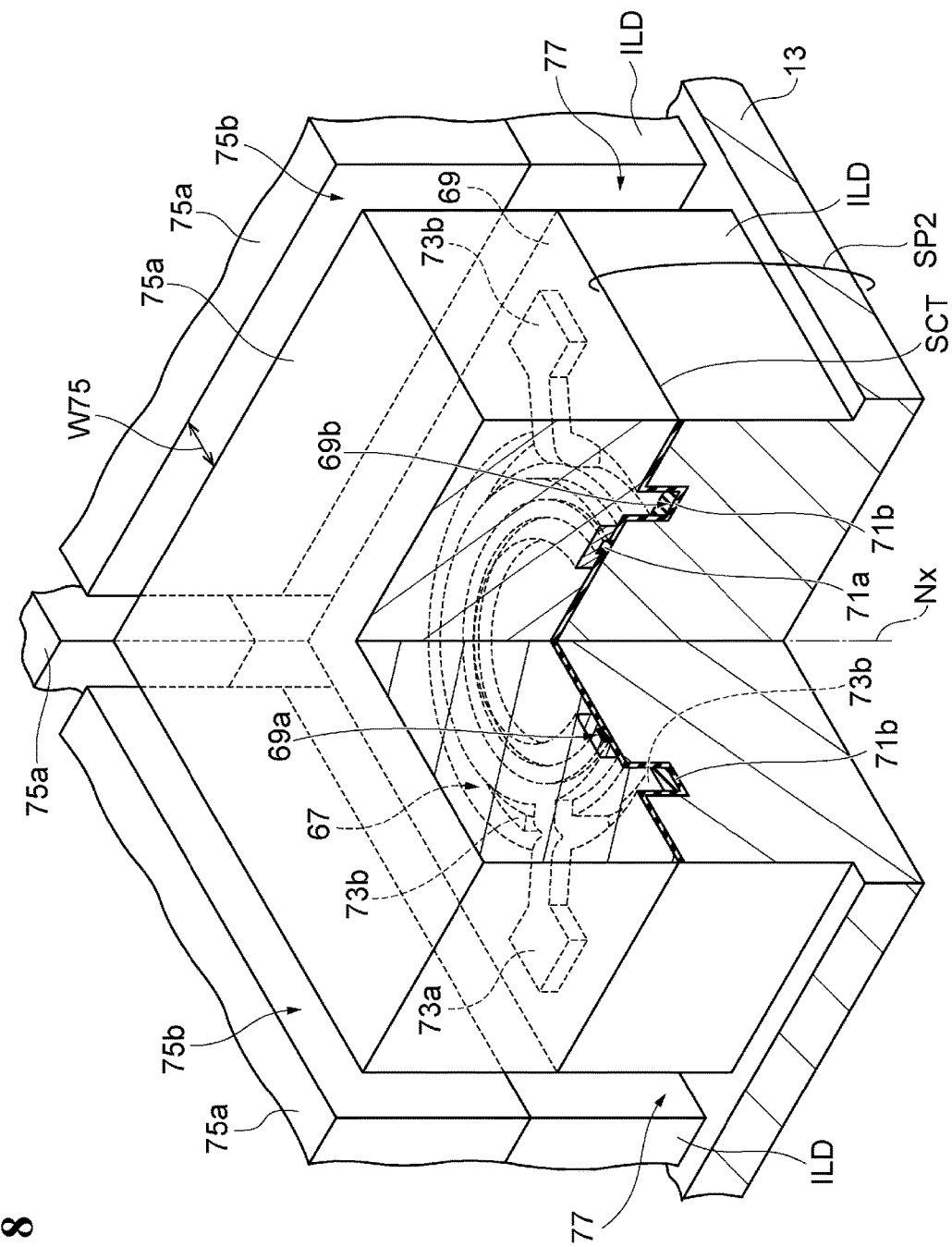
FIG. 8 is a partial cutaway view schematically illustrating a main step of the method of fabricating a surface-emitting semiconductor laser according to the present embodiment.

After the mask 75 has been formed on the first substrate product SP1, in step S107, the first side SPU of the first substrate product SP1 is etched using the mask 75, thereby a second substrate product SP2 is formed as illustrated in FIG. 8. The second substrate product SP2 has a deep groove 77 in a street region STR. The deep groove 77 penetrates through an epitaxial region and reaches the substrate 13. The device sections SCT have respective islands ILD. The second substrate product SP2 includes an array of the islands ILD separated from one another by the deep groove 77. The array of the islands ILD is defined by the deep groove 77. Furthermore, the deep groove 77 is formed so as to surround the device sections SCT.

Figure 9:
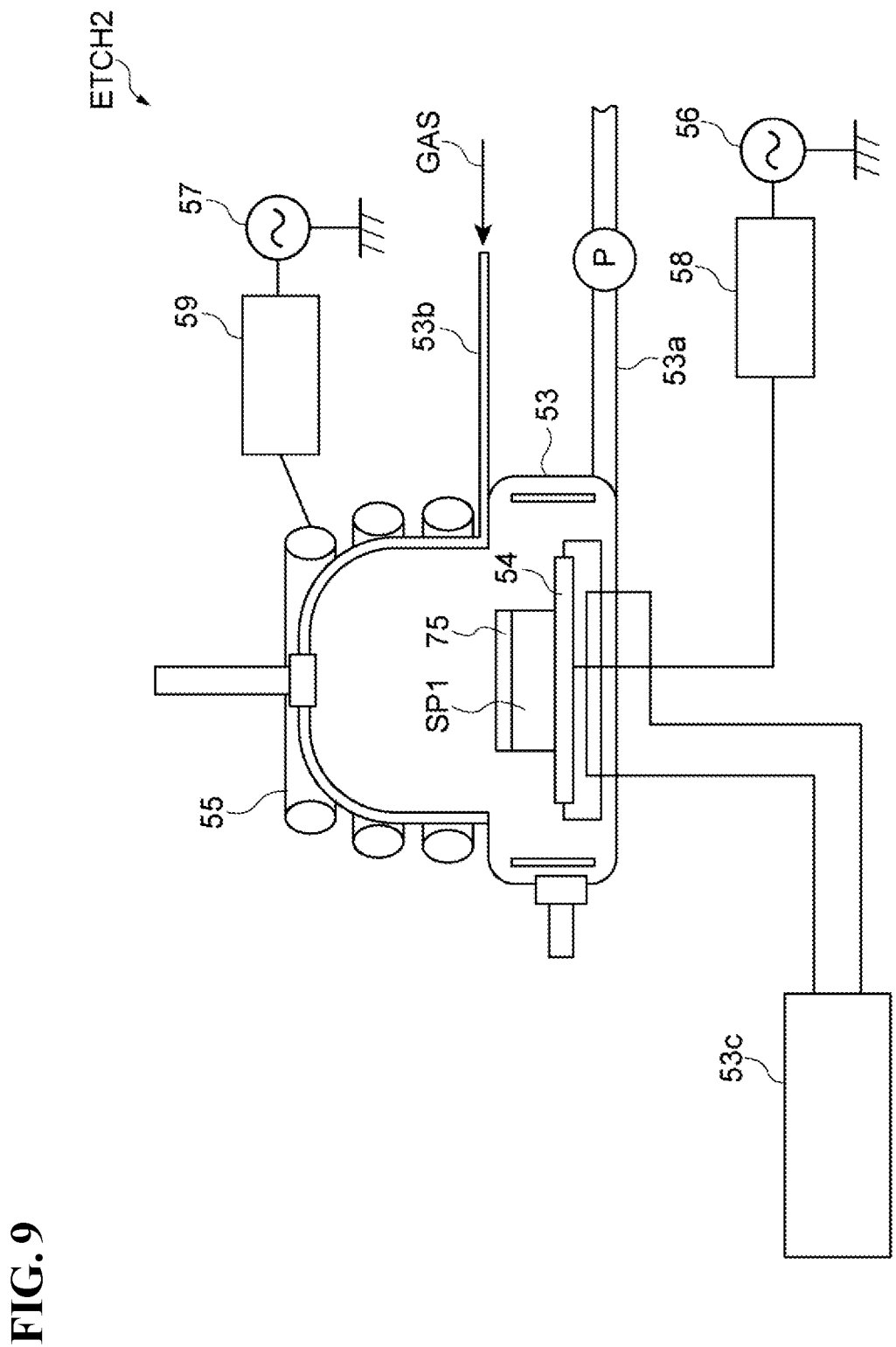
FIG. 9 schematically illustrates an etching apparatus used in the present embodiment.

For forming the deep groove 77, an etching apparatus ETCH2 as illustrated in FIG. 9 is prepared. The etching apparatus ETCH2 includes an inductive coupled plasma reactive ion etching (ICP-RIE) apparatus. Specifically, this etching apparatus ETCH2 includes a chamber 53, a lower electrode 54, an inductive coupling coil 55, a first high-frequency power source 56, and a second high-frequency power source 57. The chamber 53 is connected to a discharge pump P through a discharge channel 53a. The chamber 53 is also connected to a gas introduction system 53b for supplying gases GAS including a process gas and a raw-material gas. The chamber 53 includes a dielectric dome. Furthermore, the inductive coupling coil 55 is provided outside the dielectric dome of the chamber 53. The lower electrode 54 is provided in the chamber and allows the first substrate product SP1 to be placed thereon. The first high-frequency power source 56 is connected to the lower electrode 54 through a first impedance matching box 58. The second high-frequency power source 57 is connected to the inductive coupling coil 55 through a second impedance matching box 59. According to need, the lower electrode 54 is connected to a cooler 53c for temperature adjustment of the substrate to be placed thereon for etching.

An example of the etching conditions for forming the deep groove 77

Etchant: either of $BCl_3$ and $Cl_2$ or mixture of $BCl_3$ and $Cl_2$
Flow ratios of process gas: $BCl_3/Cl_2/Ar$=30/40/30 sccm The flow rate of chlorine (Cl$_2$) is larger than that of boron trichloride (BCl$_3$).

Etching rate: 5 to 6 micrometers/min

Detection of end point of deep groove: adjustment in accordance with etching time The power conditions BIAS power from the first high-frequency power source 56: 50 to 500 W ICP power from the second high-frequency power source 57: 1000 W or larger Temperature of substrate: preferably 25 degrees centigrade or lower Under the above-described etching conditions, a recess having a depth of about 200 micrometers is formed in the street region.

Figures 10A, 10B:
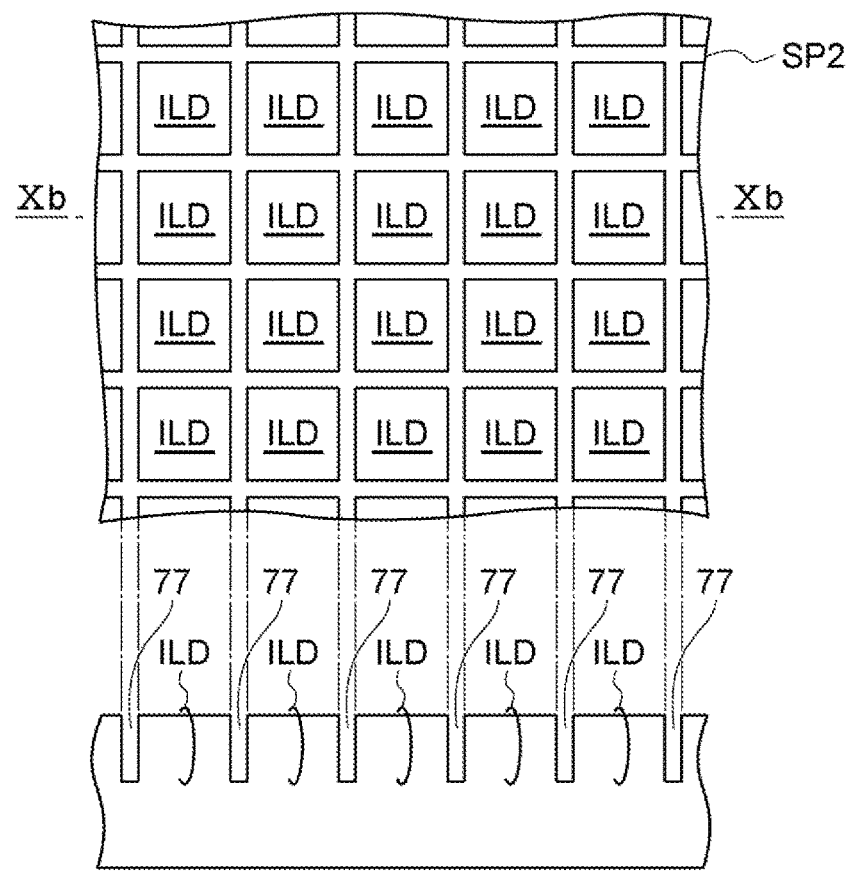
FIGS. 10A and 10B schematically illustrate the array of the device sections for the substrate product in the method of fabricating a surface-emitting semiconductor laser according to the present embodiment.

After the first substrate product SP1 has been etched, the mask 75 is removed as illustrated in FIGS. 10A and 10B in step S108. The mask 75 is removed, for example, by one or some or all of an organic solvent, a remover (such as N-methyl-2-pyrrolidone, and an oxygen plasma treatment.

In step S109, after the mask 75 has been removed, as illustrated in FIGS. 11A, 11B, and 11C, a support member such as a sheet 79 is secured to a first side of the second substrate product SP2. The first side of the second substrate product SP2 adheres to the sheet 79 due to an adhering property of the surface of the sheet 79. The sheet 79 is, for example, ultra-violet (UV) curable dicing tape, a thermally removable sheet, or a thermosensitive adhesive sheet. The second substrate product SP2 is secured to the sheet 79 held by a dicing ring. The sheet 79 have the adhering property that may provide an adhering force resisting a pressure applied during the following polishing of the substrate. Due to the thickness of a pad electrode (projection of the pad electrode) provided on each of the islands ILD, contact of the sheet 79 with a device surface DF of the island ILD may be avoided as illustrated in an enlarged view of FIG. 11C.

Figure 12A:
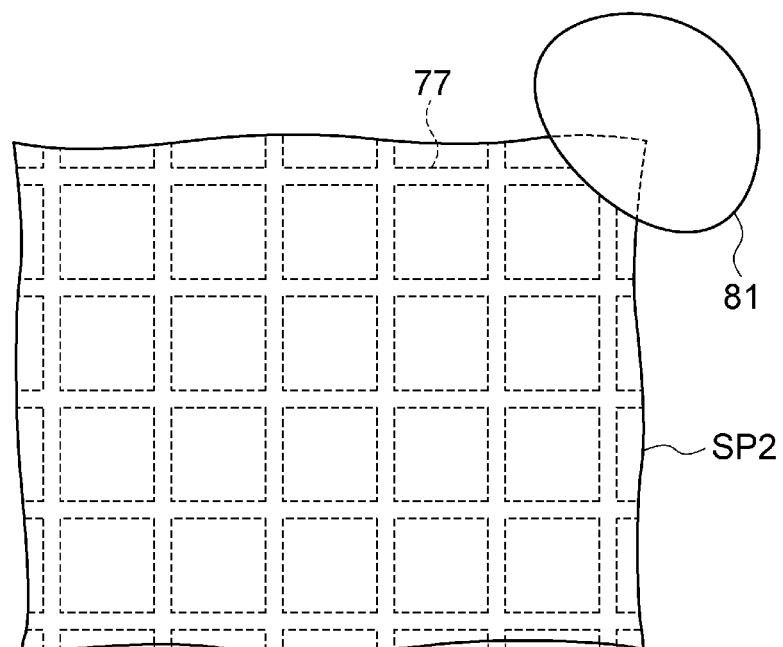
FIGS. 12A and 12B schematically illustrate the array of the device sections for the substrate product in the method of fabricating a surface-emitting semiconductor laser according to the present embodiment.
Figure 12B:
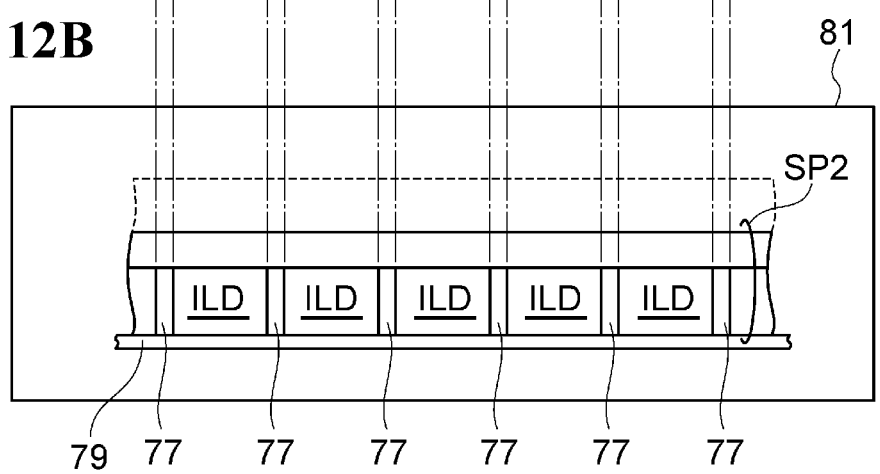

After the second substrate product SP2 has been secured to the sheet 79, the thickness of the second substrate product SP2 is reduced in step S110 to such a thickness that the deep groove 77 in the first side of the second substrate product SP2 is exposed. Specifically, as illustrated in FIGS. 12A and 12B, a second side of the second substrate product SP2 is polished by using a polishing device 81. Broken lines illustrated in FIG. 12B indicate the shape of the second substrate product SP2. The sheet 79 firmly holds the islands ILD during the polishing.

Figure 13A:
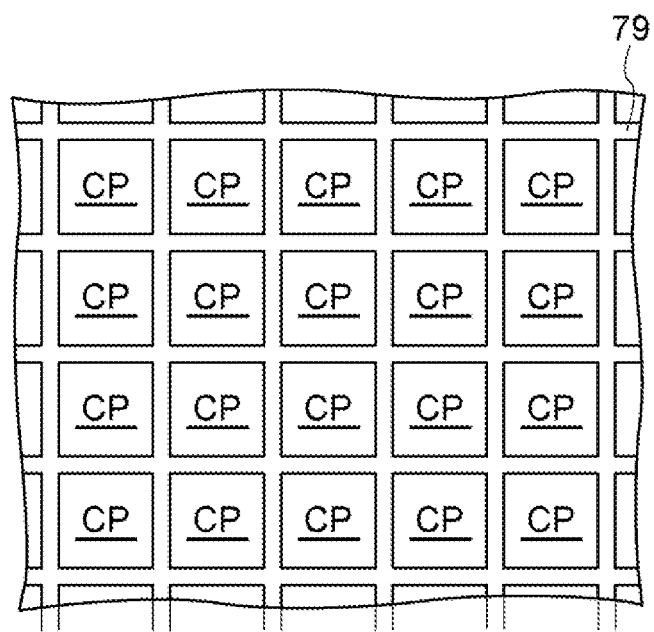
FIGS. 13A and 13B schematically illustrate an array of semiconductor chips in the method of fabricating a surface-emitting semiconductor laser according to the present embodiment.
Figure 13B:
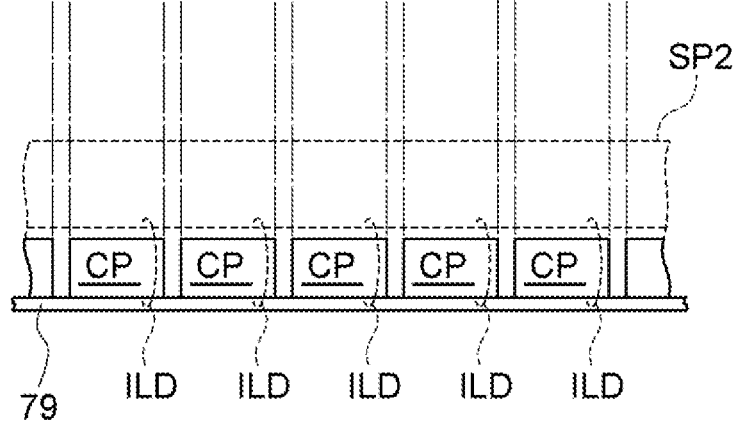

In step S111, the second side of the second substrate product SP2 is polished so that the deep groove 77 is exposed. In this step S111, the device sections SCT (islands ILD) are separated from one another so as to form an array of semiconductor chips CP on the sheet 79 as illustrated in FIGS. 13A and 13B. Broken lines illustrated in FIG. 13B indicate the shape of the second substrate product SP2. Each of the semiconductor chips CP is a so-called surface-emitting semiconductor laser chip.

Figure 14A:
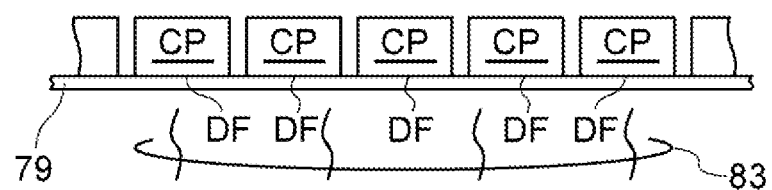
FIGS. 14A, 14B, and 14C schematically illustrate the array of the semiconductor chips in the method of fabricating a surface-emitting semiconductor laser according to the present embodiment.
Figure 14B:
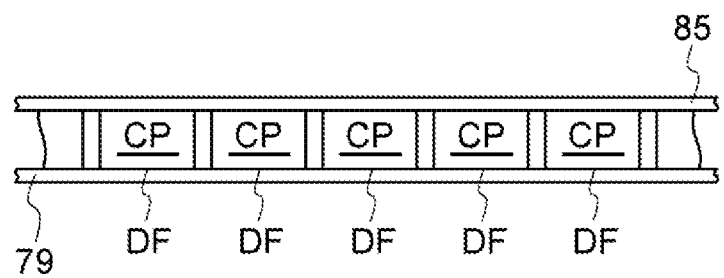
Figure 14C:
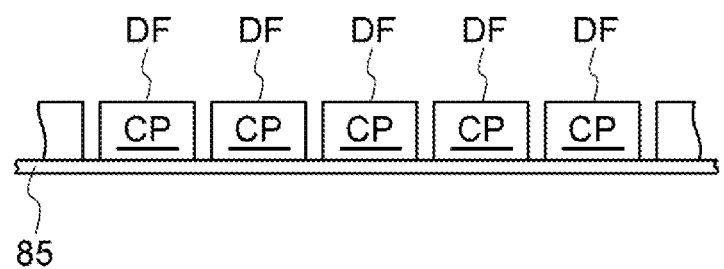

As illustrated in FIG. 14A, in step S112, the UV curable dicing tape is used as the sheet 79 in the embodiment. When the UV curable dicing tape is exposed to radiation of ultraviolet rays 83, the adhering property of the UV curable dicing tape is reduced. The semiconductor chips CP, that is, the surface-emitting semiconductor laser chips on the UV curable dicing tape are removed by using a collet from the UV curable dicing tape having been exposed to the ultraviolet radiation. As illustrated in FIG. 14B, the array of the semiconductor chips CP are transferred from the UV curable dicing tape to another support member such as a sheet 85 without removal using a collet. In the present embodiment, the sheet 85 is other UV curable dicing tape that has not been exposed to ultraviolet radiation yet. The other UV curable dicing tape supports the rear surfaces of the semiconductor chips CP, that is, the surface-emitting semiconductor laser chips. Due to the difference in adhering force between the UV curable dicing tape having been exposed to the ultraviolet radiation and the UV curable dicing tape not having been exposed to the ultraviolet radiation, the array of the semiconductor chips CP may be transferred from the sheet 79 to the sheet 85 while the array arrangement of the semiconductor chips CP is maintained. As illustrated in FIG. 14C, device surfaces of the array of the semiconductor chips CP face outward on the sheet 85. When the other UV curable dicing tape is exposed to ultraviolet radiation, an adhering property of the other UV curable dicing tape is reduced. The semiconductor chips CP (that is, the surface-emitting semiconductor laser chips) may be removed from the other UV curable dicing tape having been exposed to the ultraviolet radiation by gripping with the collet the surface sides of the semiconductor chips CP on the other UV curable dicing tape having been exposed to the ultraviolet radiation.

Figure 15:
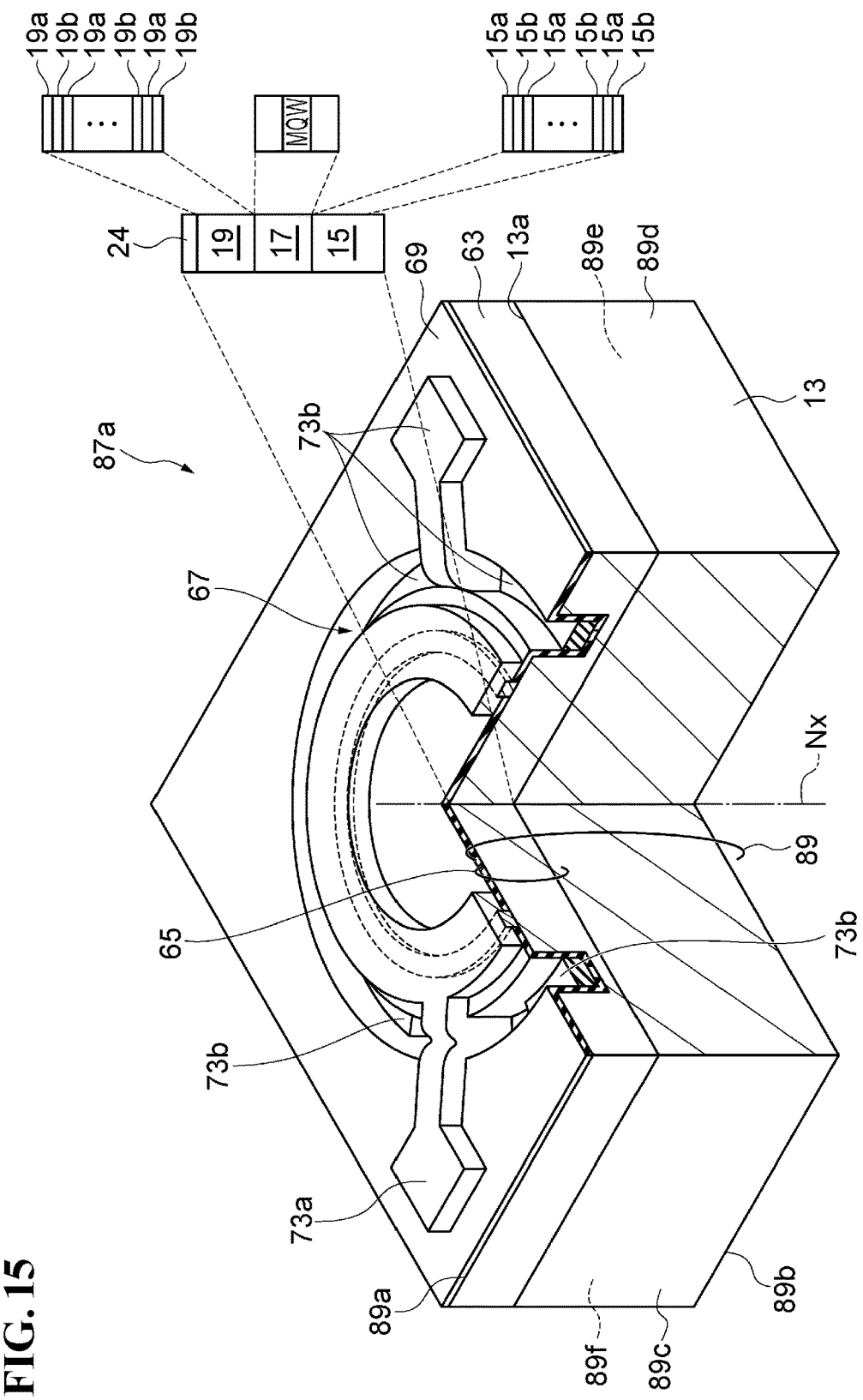
FIG. 15 is a partial cutaway view schematically illustrating the structure of a surface-emitting semiconductor laser according to the present embodiment.

Through the above-described steps, a surface-emitting semiconductor laser 87a illustrated in FIG. 15 are fabricated.

The surface-emitting semiconductor laser 87a includes the substrate 13, the passivation film 69, a semiconductor structure 89, the first electrode 73a, and the second electrode 73b. The semiconductor structure 89 includes the stacked semiconductor layer 63. The stacked semiconductor layer 63 includes the semiconductor post 65. The semiconductor post 65 includes the first stacked semiconductor layer 15 for forming the first distributed Bragg reflector, the semiconductor region 17 including the active layer, and the second stacked semiconductor layer 19 for forming the second distributed Bragg reflector. The semiconductor structure 89 includes a first side 89a, a second side 89b opposite to the first side 89a, and side surfaces (a first side surface 89c, a second side surface 89d, a third side surface 89e, and a fourth side surface 89f) that extend in a direction from the second side 89b to the first side 89a. The first electrode 73a and the second electrode 73b are provided on the first side 89a of the semiconductor structure 89. The thickness of the substrate 13 of the surface-emitting semiconductor laser 87a ranges, for example, from 100 to 200 micrometers.

The side surfaces 89c, 89d, 89e, and 89f reach the edges of the first side 89a from the edges of the second side 89b. The first side 89a abuts the upper sides of the side surfaces 89c, 89d, 89e, and 89f The upper sides of the side surfaces 89c, 89d, 89e, and 89f have no chipping. Furthermore, the side surfaces 89c, 89d, 89e, and 89f are inclined by an angle ranging from 0 to 15 degrees relative to a reference surface perpendicular to the principal surface 13a.

The side surfaces 89c, 89d, 89e, and 89f are formed by etching. Processing through etching allows the side surfaces to have a small surface roughness. In addition, processing through etching does not form chipping on the upper sides of the side surfaces. The surface-emitting semiconductor laser chip has the chipping-free device side surfaces having preferable surface roughness. The surface-emitting semiconductor laser chip requires no margins for chipping. Therefore, a device size of the surface-emitting semiconductor laser chip may be smaller than that having margins for chipping. The surface roughness Ra of the side surfaces 89c, 89d, 89e, and 89f is, for example, 100 nanometers or smaller.

Figure 16A:
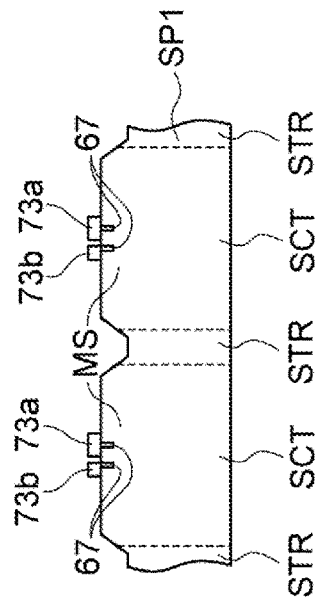
FIGS. 16A to 16D schematically illustrate main steps of the method of fabricating a surface-emitting semiconductor laser according to the present embodiment.

In the method of fabricating a semiconductor optical device, as illustrated in FIG. 16A, a mask 76 having a comparatively small thickness may be formed before the mask 75 is formed on the first side SPU of the first substrate product SP1 according to need. The mask 76 includes a device covering portions 76*a*. The edges of the device covering portions 76*a* are positioned outside the edges of the device covering portions 75*a* of the mask 75 to be fabricated in a step performed later. The device covering portions 76*a* are formed so as to surround the device sections SCT. The mask 76 has a first opening 76*b* being a single opening that defines the device covering portions 76*a*. It is preferable that the first opening 76*b* have a smaller width than the width of the street region STR defined by the mask 75. In the present embodiment, the mask 76 is formed of, for example, a resist. A resist thickness (H76) ranges from 3 to 10 micrometers. In the present embodiment, the resist thickness (H75) is, for example, 5 micrometers.

Figure 16D:
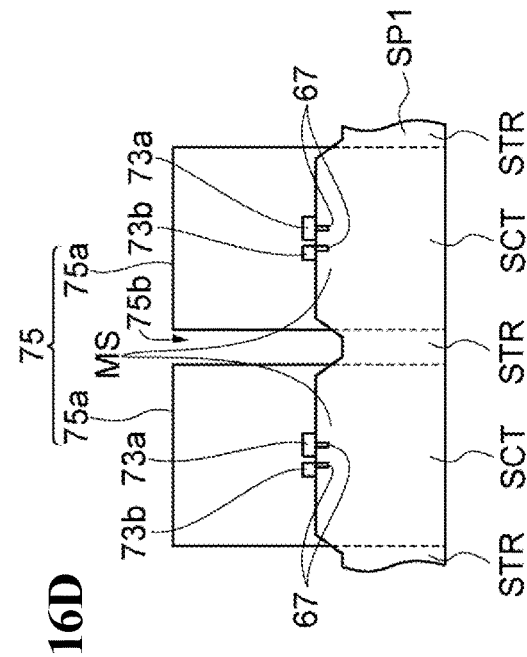
Figure 16B:
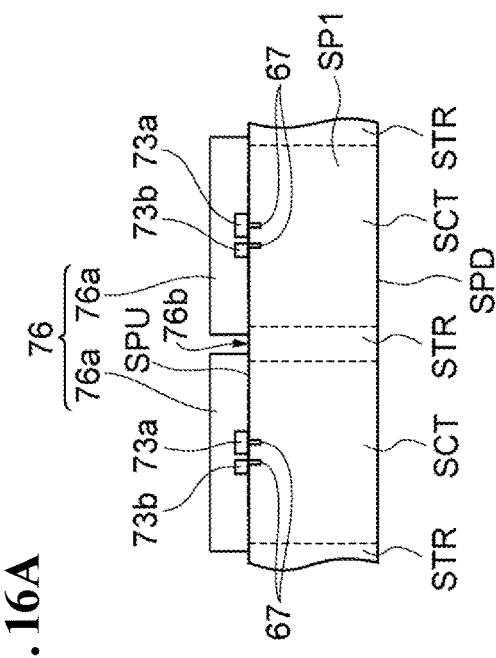

As illustrated in FIG. 16B, mesa structures MS are formed by etching the first side SPU of the first substrate product SP1 using the mask 76. This etching is performed under the conditions in which a weaker anisotropy than that of the etching using the mask 75 to be performed in a later step is exhibited.

The etching conditions using the thin mask 76
Power (ICP): from 50 to smaller than 1000 W
Power (BIAS): from 50 to 500 W
Flow ratios: $BCl_3/Cl_2/Ar=20/10/70$ sccm
The flow rate of boron chloride is larger than that of chlorine.
Process pressure: 1 Pa
The etching conditions using the mask 75
Power (ICP/BIAS): 1000 W or larger/50 to 500 W
Flow ratios: $BCl_3/Cl_2/Ar=30/40/30$ sccm
The flow rate of chlorine is larger than that of boron chloride.
Process pressure: 5 Pa The surface roughness Ra of the side surfaces of the mesa structures MS is, for example, 100 nanometers or smaller.

The height of the mesa structures MS ranges from 5 to 10 micrometers. In the present embodiment, the height of the mesa structures MS is, for example, 10 micrometers. The side surfaces of the mesa structures MS have a tapered shape. The side surfaces of the mesa structures MS are inclined at an angle in a range from 60 to 70 degrees relative to the upper surface of the substrate 13. In the present embodiment, the inclined angle of the side surfaces of the mesa structures MS is, for example, about 70 degrees. The side surfaces of the mesa structures MS have lower edges located in the street region STR and upper edges located in the device sections SCT.

Figure 16C:
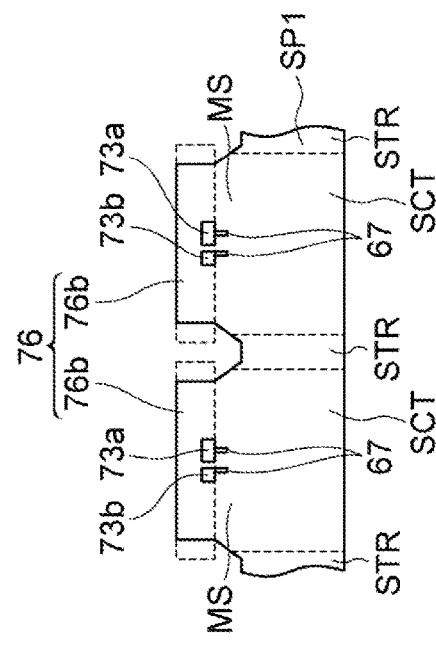

After the mesa structures MS have been formed, the mask 76 is removed as illustrated in FIG. 16C. After that, as illustrated in FIG. 16D, the mask 75 having been described is formed, and the deep groove is etched in the street region STR using the mask 75.

Figure 17:
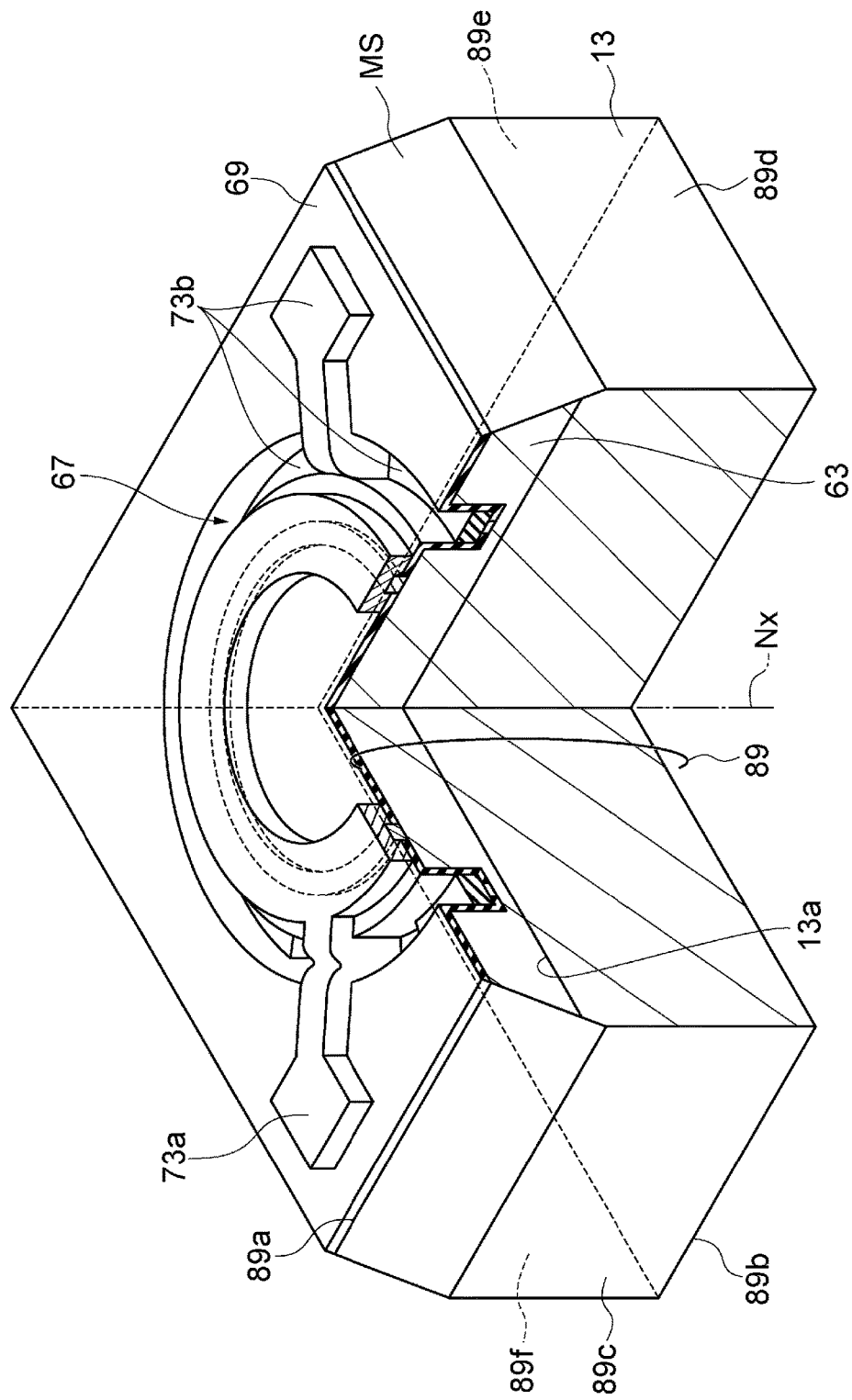
FIG. 17 is a partial cutaway view schematically illustrating the structure of the surface-emitting semiconductor laser according to the present embodiment.

Before the etching using the mask 75, in a fabrication method of forming the mesa structures MS using the mask 76, surface-emitting semiconductor lasers 87*b* are fabricated. Each of the surface-emitting semiconductor lasers 87*b* is structured as illustrated in FIG. 17. The surface-emitting semiconductor laser 87*b* has the same device structure as that of the surface-emitting semiconductor laser 87*a* except for the shapes of the tapered side surfaces of the semiconductor structure 89. The semiconductor structure 89 includes the first side 89*a*, the second side 89*b* opposite to the first side 89*a*, and the side surfaces 89*c*, 89*d*, 89*e*, and 89*f* that extend in a direction from the second side 89*b* to the first side 89*a*.

Each of the side surfaces 89*c*, 89*d*, 89*e*, and 89*f* has a lower side portion (first surface) near a corresponding one of the edges of the second side 89*b* and an upper side portion (second surface) near a corresponding one of the edges of the first side 89*a*. The first surface extends from the edge of the second side 89*b* in a direction from the second side 89*b* toward the first side 89*a*. The second surface has a taper shape. The taper-shaped second surfaces form a loop shape so as to connect a device upper surface to the first surfaces and each have a width of 20 to 30 micrometers. The height of the mesa structure MS ranges from 5 to 10 micrometers. In the present embodiment, the height of the mesa structure MS is, for example, 10 micrometers. The first side 89*a* abuts the upper sides of the taper-shaped upper portions of the side surfaces 89*c*, 89*d*, 89*e*, and 89*f*. The upper sides of the side surfaces 89*c*, 89*d*, 89*e*, and 89*f*, which are formed by etching using the mask 76, have no chipping. The side surfaces 89*c*, 89*d*, 89*e*, and 89*f* are formed by etching. Processing through etching allows the side surfaces to have a small surface roughness. In addition, processing through etching does not form chipping on the upper sides of the side surfaces. Since the surface-emitting semiconductor laser has the chipping-free device side surfaces having preferable surface roughness, it is not required to provide margins for chipping. Accordingly, the device size may be reduced. The surface roughness Ra of the taper-shaped upper side portions (side surfaces of the mesa structure MS) of the side surfaces 89*c*, 89*d*, 89*e*, and 89*f* is, for example, 100 nanometers or smaller. The taper-shaped upper side portions (side surfaces of the mesa structure MS) are each inclined at an angle in a range from 60 to 70 degrees relative to the upper surface of the substrate 13. In the present embodiment, this angle is, for example, about 70 degrees.

A contact portion of a pyramid-shaped collet is brought into contact with the side surfaces of the mesa structure MS having a normal taper shape. This reduces the possibility of breaking corners of the semiconductor chips. When handling the semiconductor chips with a collet, a super-hard pyramid-shaped collet can be used instead of a rubber collet. With the super-hard collet, inclination and misalignment of the semiconductor chips can be reduced. This can suppress positional deviation on target (destination) chips.

Examples of deviations using a rubber collet
Angular deviation: −10 to 20 degrees
Deviation in XY positions: −100 to +100 micrometers
Examples of deviations using a super-hard collet
Angular deviation: +/−5 degrees
Deviation in XY positions: −50 to +50 micrometers An area to be cut away having a width of 60 micrometers is required for cutting with a dicing blade. With the method of fabricating according to the present embodiment, the width of the street region STR that allows etching to be performed may be reduced to 10 micrometers. With this method, the degree of concentration of the device sections per wafer can be increased. For example, when semiconductor chips of 200-micrometer square are fabricated on a three-inch wafer, the number of the semiconductor chips to be fabricated with the method of fabricating according to the present embodiment can be increased to 1.5 times the number of the semiconductor chips to be fabricated with a method using a dicing blade.

Although the principles of the present invention have been illustrated and described with the preferred embodiment, it is appreciated by those skilled in the art that arrangement and details of the present invention can be changed without departing from such principles. Accordingly, a right is claimed for all modifications and changes derived from the claims and the scope of the gist of the claims.

What is claimed is:

1. A surface-emitting semiconductor laser comprising: a substrate; a first stacked semiconductor layer disposed on the substrate and including a first distributed Bragg reflector; an active layer disposed on the first stacked semiconductor layer; and a second stacked semiconductor layer disposed on the active layer and including a second distributed Bragg reflector; a first electrode; and a second electrode, the substrate, the first and second stacked semiconductor layers and the active layer providing a semiconductor structure with a first structure side, a second structure side opposite to the first structure side, and a side structure surface that extends from the second structure side to the first structure side, the side structure surface having an upper side free of chipping, the first electrode and the second electrode each being provided on the first structure side of the semiconductor structure, the semiconductor structure being formed by:

preparing a substrate product that includes a first side and a second side opposite to the first side, the first side including device sections arranged in an array and a street region extending between the device sections, at least one of the device sections including the first and second electrodes and the semiconductor structure for the surface-emitting semiconductor laser;

forming a first mask on the first side of the substrate product, the first mask having a pattern that includes device covering portions covering the respective device sections and an opening defining the device covering portions, the opening being provided in the street region;

etching the substrate product using the first mask so as to form a groove in the street region, the groove defining the device sections;

after removing the first mask, securing the first side of the substrate product to a first support member; and after securing the first side of the substrate product to the first support member, forming an array of semiconductor chips on the first support member by removing part of the substrate product from the second side until the groove provided in the first side is exposed so as to separate the at least one device section including the first and second electrodes and the semiconductor structure from other device sections to provide the surface-emitting semiconductor laser.

2. The laser according to claim 1, wherein, in forming the array of the semiconductor chips on the first support member, the substrate product is partially removed by polishing the substrate product from its second side.

3. The laser according to claim 1, wherein the laser is a vertical cavity surface-emitting laser.

4. The laser according to claim 1, further comprising transferring the array of the semiconductor chips from the first support member to a second support member.

5. The laser according to claim 4, further comprising the step of separating each of the semiconductor chips from the second support member.

6. The laser according to claim 1, wherein the first mask includes a resist having a thickness of 100 micrometers or larger.

7. The laser according to claim 1, wherein the first mask includes a dry film resist.

8. The laser according to claim 1, wherein the semiconductor structure further is formed by:

forming a second mask having a smaller thickness than a thickness of the first mask on the substrate product; and etching the substrate product using the second mask so as to form at least one mesa structure having inclined side surfaces, wherein the inclined surfaces extend from boundaries between the at least one device section and the street region, and wherein the first and second electrodes are provided on the at least one mesa structure.

* * * * *